US010291984B2

(12) United States Patent
Li et al.

(10) Patent No.: US 10,291,984 B2
(45) Date of Patent: May 14, 2019

(54) SPEAKER, TELEVISION PROVIDED WITH THE SPEAKER AND MULTIMEDIA DEVICE

(71) Applicants: BOE TECHNOLOGY GROUP CO., LTD., Beijing (CN); BEIJING BOE MULTIMEDIA TECHNOLOGY CO., LTD., Beijing (CN)

(72) Inventors: Yajun Li, Beijing (CN); Zeyang Fan, Beijing (CN); Yuanfeng Zhang, Beijing (CN); Xin Duan, Beijing (CN)

(73) Assignees: BOE TECHNOLOGY GROUP CO., LTD., Beijing (CN); BEIJING BOE MULTIMEDIA TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/895,682

(22) PCT Filed: Jun. 18, 2015

(86) PCT No.: PCT/CN2015/081727
§ 371 (c)(1),
(2) Date: Dec. 3, 2015

(87) PCT Pub. No.: WO2016/086645
PCT Pub. Date: Jun. 9, 2016

(65) Prior Publication Data
US 2016/0134955 A1    May 12, 2016

(30) Foreign Application Priority Data

Dec. 2, 2014 (CN) .......................... 2014 1 0722854

(51) Int. Cl.
*H04R 1/00* (2006.01)
*H04R 1/40* (2006.01)
*H04R 1/28* (2006.01)

(52) U.S. Cl.
CPC ............ *H04R 1/403* (2013.01); *H04R 1/2811* (2013.01); *H04R 2201/403* (2013.01); *H04R 2499/15* (2013.01)

(58) Field of Classification Search
CPC ........ H04R 1/025; H04R 1/227; H04R 1/403; H04R 1/2815; H04R 1/2823;
(Continued)

(56) References Cited

U.S. PATENT DOCUMENTS 5,588,065 A * 12/1996 Tanaka ................. H04R 1/2842
381/59
5,710,395 A * 1/1998 Wilke .................. H04R 1/2819
181/153
(Continued)

FOREIGN PATENT DOCUMENTS

CN    101023703 A    8/2007
CN    201467420 U    5/2010
(Continued)

OTHER PUBLICATIONS

The First Chinese Office Action dated May 18, 2017; Appln. No. 201410722854.0.
(Continued)

*Primary Examiner* — Matthew A Eason
(74) *Attorney, Agent, or Firm* — Ladas & Parry LLP

(57) ABSTRACT

A speaker, a television provided with the speaker and a multimedia device are provided. The speaker includes a box body and a plurality of transducer units installed within the box body by means of parallel connection: front sound cavities of the plurality of transducer units are independent of each other, respectively; and the plurality of transducer units share one back sound cavity. The speaker possesses such advantages that it has a high sound pressure level output and a smaller power consumption, it is usable to
(Continued)

reduce the back-cavity acoustic resistance, and it is usable to raise the lower frequency limit in the low frequency range.

15 Claims, 5 Drawing Sheets

(58) Field of Classification Search
CPC .. H04R 1/2826; H04R 1/2846; H04R 1/2857; H04R 1/2861; H04R 1/2869; H04R 1/2873; H04R 1/2888
See application file for complete search history.

(56) References Cited

U.S. PATENT DOCUMENTS

| | | | | |
|---|---|---|---|---|
| 5,818,942 | A * | 10/1998 | Freadman | G06F 1/1605 381/300 |
| 2005/0185801 | A1 * | 8/2005 | McCarty | H04N 5/64 381/87 |
| 2007/0201712 | A1 * | 8/2007 | Saiki | H04R 1/2834 381/186 |
| 2009/0190784 | A1 * | 7/2009 | Ong | H04R 1/2819 381/351 |
| 2013/0043089 | A1 * | 2/2013 | Rodgers | H04R 1/2826 181/144 |
| 2017/0188134 | A1 * | 6/2017 | Lage | H04R 1/227 |

FOREIGN PATENT DOCUMENTS

| | | |
|---|---|---|
| CN | 201774664 U | 3/2011 |
| CN | 201860438 U | 6/2011 |
| CN | 202514059 U | 10/2012 |
| CN | 202799032 U | 3/2013 |
| CN | 104378711 A | 2/2015 |
| RU | 22237981 C2 | 10/2004 |

OTHER PUBLICATIONS

The Second Chinese Office Action dated Aug. 8, 2017; Appln. No. 201410722854.0.
The Third Chinese Office Action dated Nov. 28, 2017; Appln. 201410722854.0.
International Search Report and Written Opinion both dated Sep. 2, 2015; PCT/CN2015/081727.

* cited by examiner

US 10,291,984 B2

SPEAKER, TELEVISION PROVIDED WITH THE SPEAKER AND MULTIMEDIA DEVICE

TECHNICAL FIELD

Embodiments of the present invention relate to a speaker, a television provided with the speaker and a multimedia device.

BACKGROUND

With the development of modern society and the improvement of our living standards, the acoustic effect of televisions brings about more and more concern of consumers. How to design speakers on the condition of a limited size and to finally obtain acoustic effects of vigorousness and exquisiteness has become a critical point of competition of strength of manufactures increasingly.

SUMMARY

According to embodiments of the present invention, there are provided a speaker, possessing the merits of output of a high sound pressure level, smaller power consumption, reduced back-cavity acoustic resistance and being usable to improve the lower frequency limit in the low frequency range, a television provided with the speaker and a multimedia device.

According to at least one embodiment of the invention, there is provided a speaker, which includes a box body and a plurality of transducer units installed within the box body by means of parallel connection; front sound cavities of the plurality of transducer units being independent of each other, respectively; and the plurality of transducer units sharing one back sound cavity.

According to at least one embodiment of the invention, there is further provided a television, which includes a housing and the above-mentioned speaker disposed on the housing in correspondence, the housing being configured to coordinate with the speaker on correction of the sound wave phase.

According to at least one embodiment of the invention, there is further provided a multimedia device, which includes the above-mentioned speaker.

BRIEF DESCRIPTION OF THE DRAWINGS

In order to illustrate the technical solution in the embodiments of the invention more clearly, the drawings of the embodiments will be briefly introduced below; it is obvious that the drawings as described below are only related to some embodiments of the invention, and but are not limitative of the invention.

Figure 1:
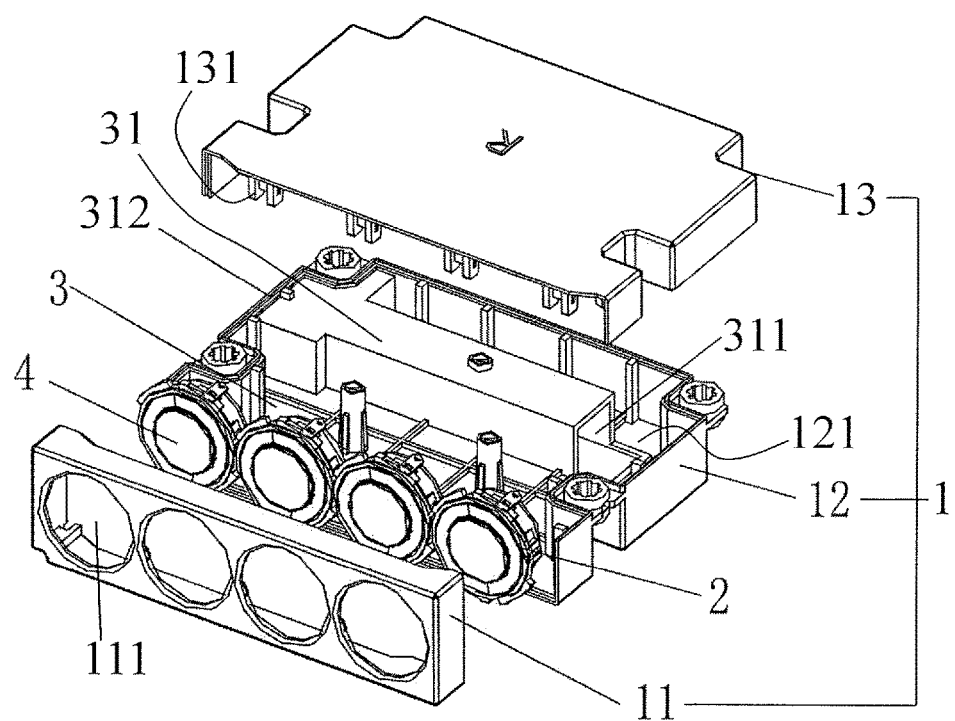
FIG. 1 is a stereoscopically exploded view illustrating a speaker according to an embodiment of the invention.
Figure 2:
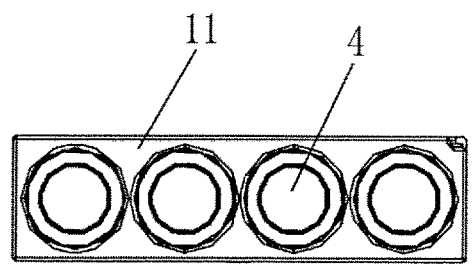
FIG. 2 is a front view illustrating a speaker according to an embodiment of the invention.
Figure 3:
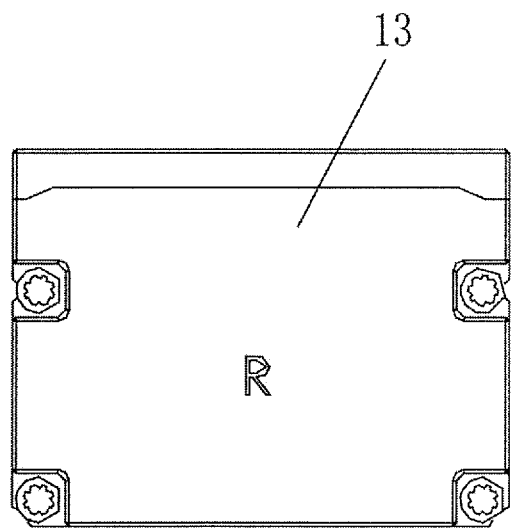
FIG. 3 is a top view illustrating a speaker according to an embodiment of the invention.

Reference numerals: 1: a box body; 2: a transducer unit; 3: a back sound cavity; 4: a front sound cavity; 5: a rear cover of a back panel of a television; 6: a holder of a back panel of a television; 11: a front cover; 111: a radiating hole; 12: a lower cover; 121: a face of a lower cover 12; 13: an upper cover; 131: a strengthening rib; 31: a phase reversing hole; 32: a bass unit; 7: a housing.

DETAILED DESCRIPTION

In order to make objects, technical details and advantages of the embodiments of the invention apparent, hereinafter, the technical solutions in the embodiments of the invention will be described in a clearly and fully understandable way in connection with the drawings in the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used in the present disclosure should have the same meaning as commonly understood by one of ordinary skill in the art to which this invention belongs. "First", "second" and the like used in the present disclosure do not show any order, number or importance, but are only used to distinguish different constituent parts. Likewise, a term "a," "an," or the like does not indicate limitation in number, but specifies the presence of at least one. A term "comprises," "comprising," "includes," "including", "contains" or the like means that an element or article ahead of this term encompasses element(s) or article(s) listed behind this term and its (their) equivalents, but does not preclude the presence of other elements or articles. A term "connection," "connected," or the like is not limited to physical or mechanical connection, but can include electrical connection, whether directly or indirectly. "Upper," "lower," "left," "right" or the like is only used to describe a relative positional relationship, and when an absolute position of the described object is changed, the relative positional relationship might also be changed accordingly.

In order to improve the acoustic effect, a speaker system known by the inventor(s) includes a box body, at least one speaker unit attached to the box body and a plurality of passive radiators attached to the box body, and each of the passive radiators includes a vibrating diaphragm and a supporting system for supporting the vibrating diaphragm. A multi-monomer box-type structure is proposed in the speaker system, but the passive radiators used by it are susceptible to a peripheral vibration of the box body and a high-frequency nonlinear vibration per se and a frequency response distortion and a noise disturbance result from this, and the power consumption of each monomer cannot be reduced sufficiently during its usage.

Furthermore, as regards a speaker module known by the inventor(s), it includes a box body and a speaker, the overall shape of the box body is a rectangle, and at least one closed chamber is arranged within the box body. Moreover, within the box body, there is further included one cavity located on the backside of the closed chambers, and a plurality of labyrinth transmission lines are arranged inside the cavity. A back-cavity acoustic resistance is increased by the labyrinth transmission lines, which leads to a larger sound wave attenuation in a back cavity and counts against improvement of total sound pressure level, and a resonant peak of a low-frequency harmonic wave occurs easily in the frequency response curve.

Thus, aiming at the above drawbacks, there is a need for a speaker capable of possessing an output of high sound pressure level and a smaller power consumption, reducing the back-cavity acoustic resistance and raising a lower frequency limit in the low frequency range and a television provided with the speaker.

Embodiment 1

As illustrated in FIG. 1, a speaker provided by the embodiment includes a box body 1 and a plurality of transducer units 2 installed within the box body 1 by way of parallel connection, front sound cavities 4 of the plurality of transducer units 2 are independent of each other, respectively, and the plurality of transducer units 2 share one back sound cavity 3.

A plurality of transducer units 2 is used in the embodiment, and in this way, under the condition of the same total power, the power consumed by each of the transducer units is relatively small, and the total sound pressure level can also be effectively raised. This will be illustrated with an example. When the number of transducer units 2 connected in parallel is four, under the condition of the same total power, only ¼ of the power is consumed by each of the transducer units 2, but the total sound pressure level can be raised by 6 dB. Furthermore, front sound cavities 4 of the plurality of transducer units 2 are independent of each other, respectively, for radiating sound waves from the front; meanwhile, the plurality of transducer units 2 share one back sound cavity 3, so that the effective volume of the box body 1 can be increased, and then, the back-cavity acoustic resistance is effectively reduced and a lower frequency limit in the low frequency range is enhanced. The speaker is proposed under the restriction of specific television size and power, and as compared to a conventional scheme in the market, it has the merits of output of high sound pressure level and smaller power consumption.

In at least one example of the present embodiment, the plurality of transducer units 2 may adopt an electrodynamic type, and all of them belong to autonomous signal excitation. As such, a frequency response distortion caused by vibration of other device can be effectively avoided.

Figure 6:
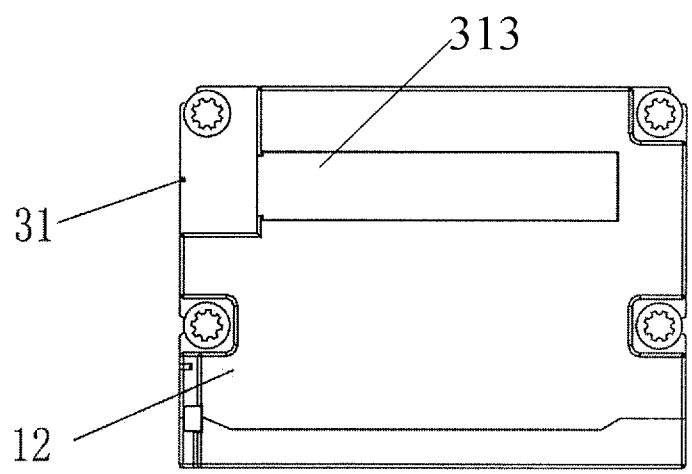
FIG. 6 is a bottom view illustrating a speaker according to an embodiment of the invention.

In order to further increase the sound pressure level, and improve the quality sense of bass, as illustrated in FIG. 1 and FIG. 6, a phase reversing hole 31 is provided at the bottom of the box body 1 and is communicated with the back sound cavity 3, and regarding its roles, the first is to reduce the resonance of the box body, so as to avoid voiced sound and television vibration; and the second is to let sound waves in the back sound cavity radiate outward, so as to raise the sound pressure level.

Figure 4:
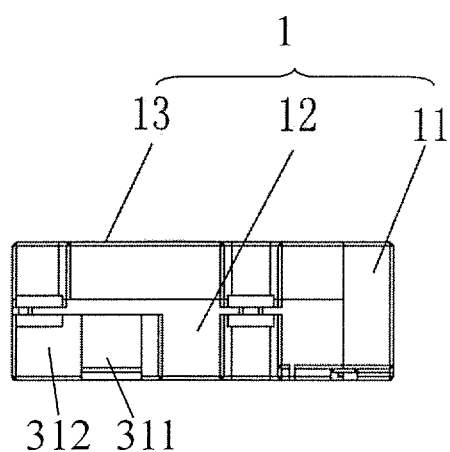
FIG. 4 is a left view illustrating a speaker according to an embodiment of the invention.
Figure 5:
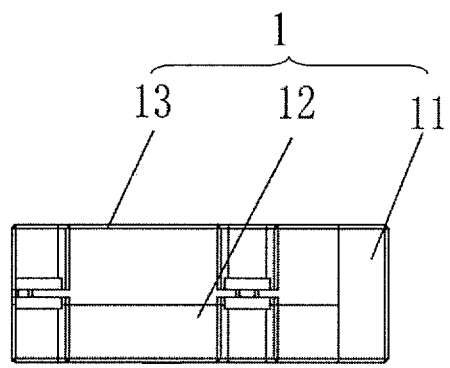
FIG. 5 is a right view illustrating a speaker according to an embodiment of the invention.

For example, as illustrated in FIGS. 1, 4 and 6, the phase reversing hole 31 includes a first opening 311, a second opening 312 and a third opening 313. The first opening 311 is useful for allowing the phase reversing hole 31 to be communicated with the back sound cavity 3, and the second opening 312 and the third opening 313 are useful for allowing the phase reversing hole 31 to be communicated with outside of the box body.

In at least one example, as illustrated in FIGS. 1 to 5, the box body 1 includes a front cover 11, an upper cover 13 and a lower cover 12. The upper cover 13 is snap-fitted onto the lower cover 12, and the front cover 11 is assembled to one side, so as to form a box body. Moreover, a plurality of radiating holes 111 in correspondence with the front sound cavities 4 are arranged at an interval in the front cover 11. For example, in order to ensure that front sound cavities 4 of transducer units 2 are airtight to each other, all the airtightness can be achieved by using an ultrasonic welding process. As such, it can be ensured that there is no sound leakage and the appearance is excellent.

For example, the phase reversing hole 31 runs through the lower cover 12. It is worth noting that, the opening direction of the phase reversing hole 31 (e.g. the orientation of the first opening 313) is not limited to some specific form, and can be flexibly designed according to a rear housing of a television in cooperation with it. For example, the opening direction of the phase reversing hole 31 is perpendicular to a face 121 of the lower cover 12, and makes an angle of 90 degrees with the sound wave radiating direction of the back sound cavity 3, and by doing this, the phase of a sound wave can be shifted by 90 degrees. Then, with the help of confinement of mounting structure of the rear housing of the television, the phase of the sound wave is shifted again by such as 90 degrees. Consequently, it becomes balanced with the phase of a sound wave irradiated from the front, so as to further raise the sound pressure level and improve the quality sense of bass.

For example, a plurality of transducer units 2 may be mounted on the front cover 11 by a supporting baffle, and axial lines of the plurality of transducer units 2 are disposed in a coplanar manner. Namely, the plurality of transducer units 2 are arranged on the same horizontal plane in order.

Figure 7A:
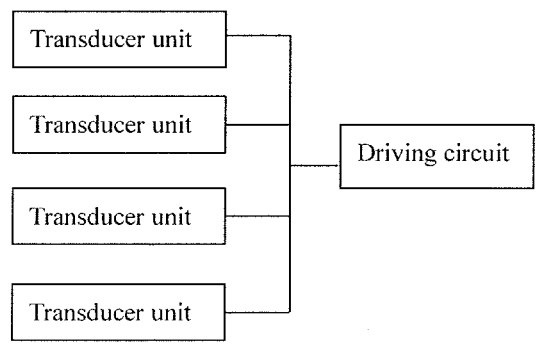
FIG. 7a is a block diagram illustrating the connection of transducer units in parallel by a driving circuit in an embodiment of the invention.

For example, as illustrated in FIG. 7a, the plurality of transducer units 2 are connected in parallel by a driving circuit, which is useful for driving vibrating diaphragms of the transducer units 2 to vibrate, so as to form sound waves.

For example, substance of the vibrating diaphragms may be a metallic substance, while in consideration of tone quality and cost, the vibrating diaphragms may be circular vibrating diaphragms of aluminum substance, and a circular sound issuing face is formed when they vibrate, so that the axial response is more flat than is the case with the oval one.

For example, a damping layer for reducing the sound wave reflection may also be provided on a vibrating diaphragm, and a width of the damping layer may be in the range of 2.8 mm to 3.2 mm. The effective reduction in the boundary reflection of sound waves and distortion caused by high-frequency nonlinearity can be realized by the cooperation of the clamping layer with a circular vibrating diaphragm of aluminum substance, so that the bass is vigorous, the alto is rich and powerful, and the treble is exquisite and nice.

It is worth noting that, the number of the plurality of transducer units 2 can be flexibly adjusted according to actual requirements, and an even number is optimum. For example, the number of the plurality of transducer units 2 is four.

In addition, the shape of the box body 1 may not be limited to some specific shape, either. Description has been given to an example in which the box body 1 takes the shape of a rectangle in the present embodiment, and certainly, box bodies in other shape also belong to the protection scope of the invention. Besides, between the front cover 11, the upper cover 13 and the lower cover 12, a bolted connection may be adopted, and a snap-fitting connection may be adopted as well, so as to facilitate assembly.

Of course, on the basis of the above structure, for example, a plurality of strengthening ribs 131 for eliminating the resonance of the box body may be provided on the upper cover 13, as illustrated in FIG. 1. For example, a reinforcing device for enhancing stability of transducer units 2 may also be added to the lower cover 12.

Embodiment 2

Figure 7B:
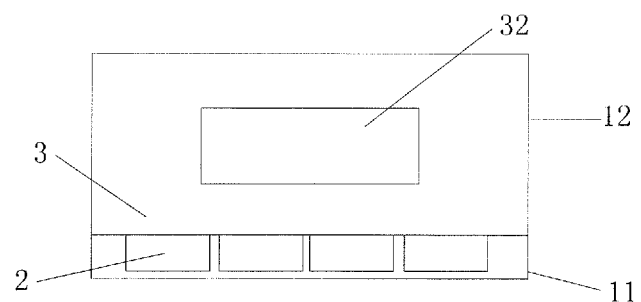
FIG. 7b is a schematic view illustrating partial structure of a speaker provided with bass unit, provided by an embodiment of the invention.

The technical contents of the present Embodiment 2 that are the same as those of Embodiment 1 will not be repetitively described any more, and contents disclosed by Embodiment 1 also belong to contents disclosed by the present Embodiment 2. The Embodiment 2 differs from Embodiment 1 in that, as illustrated in FIG. 7b, a phase reversing hole 31 at the bottom of a box body is replaced with a bass unit 32. The bass unit 32 is situated within a back sound cavity 3, and the radiating direction of the bass unit is orientated toward the bottom of the back sound cavity 3. It is to be noted that, FIG. 7b is only a schematic diagram, the shape and size of each part in FIG. 7b do not reflect the true scale, and FIG. 7b only shows a part of structures such as a front cover 11 and a lower cover 12 of a box body, transducer units 2 provided in the box body and so on, and does not show an upper cover of the box body and other structures.

A woofer commonly used in the field may be used as the bass unit. Detailed descriptions will not be made in embodiments of the invention.

On the premise that the overall appearance and technical means of achieving remain unchanged, the phase reversing hole 31 is changed to be one bass unit at the bottom. By doing this, for example, the total monomer number is five: four transducer units 2 at a front radiating face adopt a parallel driving mode, and a bass unit in the back sound cavity 3 adopts a hardware frequency-dividing mode and is driven independently. Although requirements on power amplifiers are promoted somewhat in the embodiment, the overall bass feeling brought about by it is better than that of a previous scheme. It can be watched in movie mode even when the acoustic effect is not imparted, so that ordinary domestic users can experience the real bass feeling of a television in itself as well.

Figure 8:
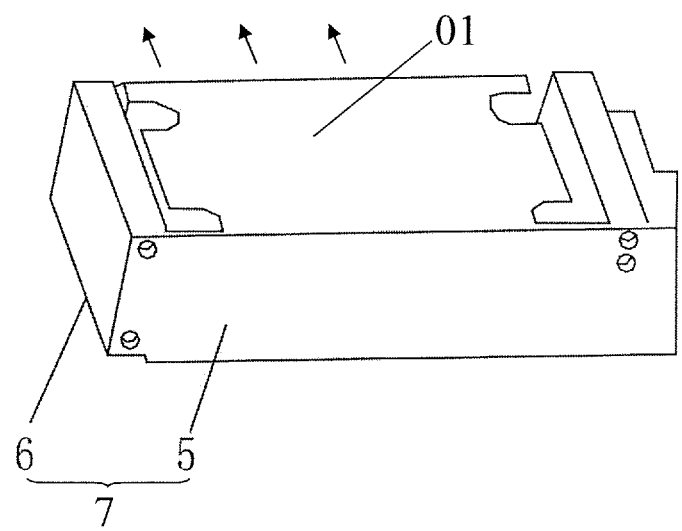
FIG. 8 is a schematic view illustrating the assembly of a speaker and a television according to an embodiment of the invention.

Furthermore, according to at least one embodiment of the invention, there is further provided a television. As illustrated in FIG. 8, the television includes a housing 7 and a speaker 01 provided by any of the above embodiments. The speaker 01 is provided on the housing 7 in correspondence; the housing 7 is completely sealed, has no sound leakage, and acts to coordinate with the speaker on correction of the acoustic wave phase.

For example, the housing 7 includes a holder 6 of a back panel of a television and a rear cover 5 of the back panel of the television disposed on the holder 6 of the back panel of the television, and an accommodating space for installment of the speaker is enveloped by the rear cover 5 of the back panel of the television and the holder 6 of the back panel of the television. As illustrated in FIG. 1 and FIG. 8, the speaker 01 includes a box body 1 and a plurality of transducer units 2 installed within the box body 1 by means of parallel connection, front sound cavities 4 of the plurality of transducer units 2 are independent of each other, respectively, and configured for radiating sound waves from the front (the sound wave radiating direction is illustrated, for example, by the arrow direction in FIG. 8); the plurality of transducer units 2 shares one back sound cavity 3, and a phase reversing hole 31 is provided at the bottom of the box body 1. For example, the phase reversing hole 31 makes an angle of 90 degrees with the sound wave radiating direction of the back sound cavity 3, so that the phase of a sound wave is shifted by 90 degrees; then, with the help of phase reversing effect of the rear cover 5 of the back panel of the television, the phase of the sound wave is shifted again by 90 degrees. Where, the phase reversing effect is that, the speaker 01 is assembled between the rear cover 5 of the back panel of the television and the holder 6 of the back panel of the television, and a certain gap is formed on a side of the speaker. A sound wave that irradiate downward vertically and sideward from the phase reversing hole 31 is sheltered by the rear cover 5 of the back panel of the television and the holder 6 of the back panel of the television and changes its direction, and eventually, it will irradiate from the front (i.e. the irradiating direction of a front sound cavity 4) along the gap, and becomes balanced with the phase of a sound wave irradiated from the front. Thus, the acoustic effect of bass is enhanced, and the sound pressure level is raised.

Of course, the housing 7 further includes an upper cover of the back panel of the television (not illustrated in the figure) that is hermetically connected to the holder 6 of the back panel of the television and the rear cover 5 of the back panel of the television and so on, and details are omitted here.

Figure 9:
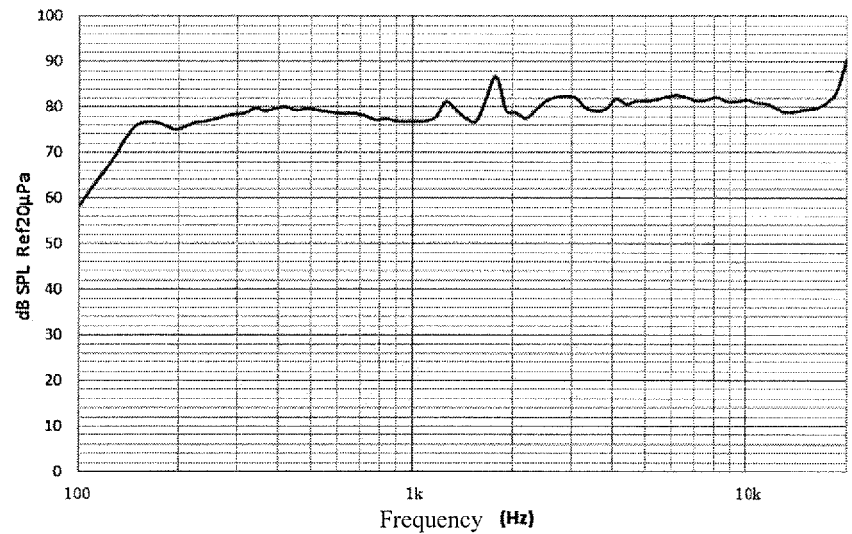
FIG. 9 is a test chart illustrating a frequency response curve of a speaker according to an embodiment of the invention.
Figure 10:
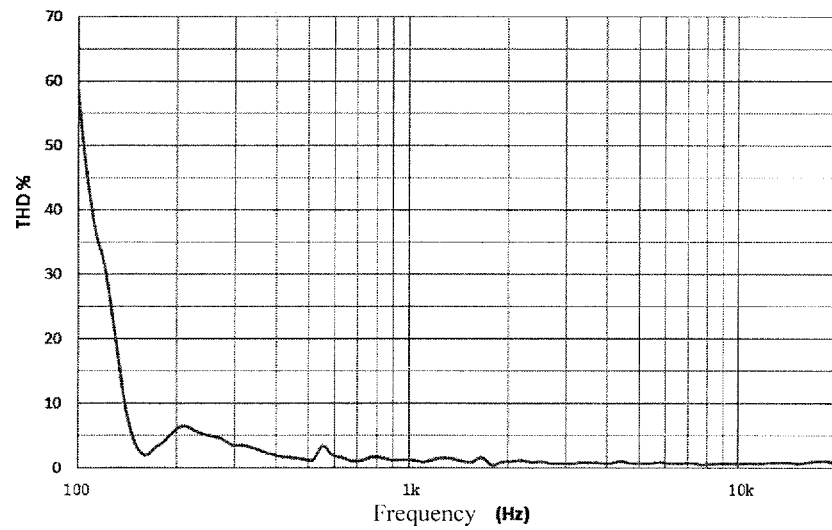
FIG. 10 is a test chart illustrating a distortion curve of a speaker according to an embodiment of the invention.

After the speaker is assembled to a television, a subjective evaluation of the tone quality is made. It has been found in the evaluation that, the bass is surging and shocking, the alto is plentiful and powerful, the treble is exquisite and ear-pleasing, and the overall tone quality is noble and fair-sounding, so that acoustic effects at the professional level can be attained. In the actual installment test, its frequency response test curve is illustrated in FIG. 9. The horizontal ordinates represent the frequency band (in Hz), that is, the frequency range between the highest frequency at which signal transmission is allowed and the lowest frequency at which signal transmission is allowed, and the longitudinal ordinates represent the sound pressure level (in dB). The speaker possesses a band from 100 Hz to 20 KHz, and an average sound pressure level up to 81 dB, and has the traits of high sound pressure level output. And the distortion curve in correspondence with it is illustrated in FIG. 9, the horizontal ordinates also represent the frequency band (in Hz), and the longitudinal ordinates represent the degree of distortion (briefly called as THD), denoted by percentage. In FIG. 10, the distortion below 300 Hz is only 7%, and the distortion in the range of 300 Hz to 20 kHz is less than 5%, and lower than 3% when it is further optimized. As can be seen, with the speaker, a low distortion effect of the sound can be effectively assured.

According to at least one embodiment of the invention, there is further provided a multimedia device, which includes the speaker as stated by any of the above embodiments. The multimedia device may be a display, a camera, a computer, a television or any other product or component that can have functions of broadcasting sounds and displaying images. Regarding the set mode of a speaker in the multimedia device, reference can be made to relevant descriptions in above embodiments of television, and repetitions are omitted here.

In summary, according to embodiments of the invention, there are provided a speaker, a television provided with the speaker and a multimedia device. The speaker includes a box body and a plurality of transducer units installed within the box body by means of parallel connection. Front sound cavities of the plurality of transducer units are independent of each other, respectively, and share one back sound cavity, so that it can play the roles of attaining a high sound pressure level output and a smaller power consumption, reducing the back-cavity acoustic resistance, and raising the lower frequency limit in the low frequency range. Furthermore, in at least one embodiment of the invention, the speaker can be assembled onto a television, and correction of sound wave phase is achieved by its cooperation with a rear housing of the television. Thus, it has such advantages that the sound is pure and ear-pleasing, the tessitura is wide and rich, and it is energy-saving and environmentally protective.

Descriptions made above are merely exemplary embodiments of the invention, but are not used to limit the protection scope of the invention. The protection scope of the invention is determined by attached claims.

This application claims the benefit of priority from Chinese patent application No. 201410722854.0, filed on Dec. 2, 2014, the disclosure of which is incorporated herein in its entirety by reference as a part of the present application.

The invention claimed is:

1. A speaker, comprising a box body and a plurality of transducer units installed within the box body by means of parallel connection; front sound cavities of the plurality of transducer units being independent of each other, respectively; and the plurality of transducer units sharing one back sound cavity,
   wherein the box body comprises a front cover, an upper cover and a lower cover, the upper cover is snap-fitted onto the lower cover, the front cover is assembled with the upper cover and the lower cover so as to form the box body,
   a phase reversing hole is provided to run through the lower cover of the box body, comprising a first opening, a second opening and a third opening; an orientation of the first opening is opposite to an orientation of the second opening; the first opening allows the phase reversing hole to be communicated with the back sound cavity, and the second opening and the third opening allow the phase reversing hole to be communicated with outside of the box body, and
   an orientation of the third opening is perpendicular to the orientation of the first opening and the orientation of the second opening, and makes an angle of 90 degrees with a sound wave radiating direction of the back sound cavity.

2. The speaker claimed as claim 1, wherein a plurality of radiating holes in correspondence with the front sound cavities are arranged at an interval in the front cover.

3. The speaker claimed as claim 2, wherein, a plurality of strengthening ribs for reducing a resonance of the box body are provided on the upper cover.

4. The speaker claimed as claim 2, wherein, axial lines of the plurality of transducer units are disposed in a coplanar manner.

5. The speaker claimed as claim 1, wherein, axial lines of the plurality of transducer units are disposed in a coplanar manner.

6. The speaker claimed as claim 1, wherein, the plurality of transducer units are connected in parallel by a driving circuit, and the driving circuit is configured to drive vibrating diaphragms of the transducer units to vibrate.

7. The speaker claimed as claim 6, wherein, damping layers for reducing the sound wave reflection are provided on the vibrating diaphragms.

8. The speaker claimed as claim 1, wherein, the number of the plurality of transducer units is four.

9. A television, comprising a housing and the speaker claimed as claim 1, wherein, the speaker is disposed on the housing in correspondence, and the housing is configured to coordinate with the speaker on correction of a sound wave phase.

10. A multimedia device, comprising the speaker claimed as claim 1.

11. The television claimed as claim 10, wherein, a plurality of radiating holes in correspondence with the front sound cavities are arranged at an interval in the front cover.

12. The television claimed as claim 11, wherein, a plurality of strengthening ribs for reducing a resonance of the box body are provided on the upper cover.

13. The television claimed as claim 11, wherein, axial lines of the plurality of transducer units are disposed in a coplanar manner.

14. The television claimed as claim 9, wherein, axial lines of the plurality of transducer units are disposed in a coplanar manner.

15. The television claimed as claim 9, wherein, the plurality of transducer units are connected in parallel by a driving circuit, and the driving circuit is configured to drive vibrating diaphragms of the transducer units to vibrate.

* * * * *